United States Patent [19]

Sutterlin

[11] Patent Number: 4,972,158
[45] Date of Patent: Nov. 20, 1990

[54] TRANSISTOR AMPLIFIER WITH VARIABLE BIAS CIRCUITS

[75] Inventor: Philip H. Sutterlin, Durham, N.C.

[73] Assignee: International Business Machines Corporation, Armonk, N.Y.

[21] Appl. No.: 429,669

[22] Filed: Oct. 31, 1989

[51] Int. Cl.$^5$ .............................................. H03F 3/45
[52] U.S. Cl. .................................. 330/255; 330/257; 330/261
[58] Field of Search ................ 330/255, 257, 261, 273

[56] References Cited
FOREIGN PATENT DOCUMENTS

| 48512 | 12/1985 | Japan | 330/255 |
| 15911 | 1/1987 | Japan | 330/257 |
| 48707 | 7/1987 | Japan | 330/257 |

Primary Examiner—James B. Mullins
Attorney, Agent, or Firm—Joscelyn G. Cockburn

[57] ABSTRACT

Described is an improved electrical amplifier including a circuit arrangement which biases the amplifier so that current in an output stage of the amplifier is constant even though its load current varies. The circuit arrangement is configured so that the biasing current in the output stage is varied dynamically, thus compensating for changes in the current of the load which the amplifier drives.

13 Claims, 2 Drawing Sheets

TRANSISTOR AMPLIFIER WITH VARIABLE BIAS CIRCUITS

BACKGROUND OF THE INVENTION

1. Field of the Invention

The invention relates to amplifiers in general and more particularly to devices and techniques that improve the operating characteristics of such amplifiers.

2. Prior Art

Transistor amplifiers are widely used in different types of electronic equipment. A fundamental tradeoff in the design of an amplifier is that of power consumption versus performance. A typical transistor amplifier has at least an input stage which accepts an input signal, one or more intermediate stages and an output stage which delivers the input signal to a load circuit. Power for the amplifier is supplied from a power source connected to the amplifier.

The output stage of the amplifier frequently operates in what is known as the large signal region of operation. In this region of operation the signal or load current is the same order of magnitude as the quiescent or bias current. When an amplifier is operating in this large signal mode, many of its characteristics vary as a function of the signal level. For example, some of the critical performance characteristics which vary with operating currant include output impedance, bandwidth and linearity.

Even though the above problem occurs in several types of amplifier topologies, its effect is noticeable in a common emitter follower configuration which is used to illustrate the problem. FIG. 1 shows an electrical schematic of a prior art emitter follower amplifier operating in a class A mode. When the output voltage ($V_o$) rises towards a maximum, the emitter current ($I_e$) of the transistor is Ilmax.+Iq. When the output voltage decreases towards 0 volts, Il decreases and the emitter current of Q'1 approaches Iq. As the output voltage goes negative, the load current (Il) goes negative and the emitter current of Q'1 decreases towards 0.

The result of this large signal operation is that Q'1 collector current could vary from Iq +Ilmax. to no current at all. Since many transistor parameters are a function of collector current, the performance of the amplifier can vary significantly with signal levels and is thus non-linear.

The prior art has provided several techniques to compensate for the non-linearity in amplifiers. One obvious technique is to increase Iq in order to have it dominate over Il variations. This technique would improve linearity at the expense of power consumption.

Another prior art technique used for improving the non-linear characteristics of amplifiers is negative feedback. Even though this technique works well for its intended purpose, it has drawbacks which adversely affect the operation of the amplifier. The ability of negative feedback to improve performance is limited by the amount of excess gain available as well as stability limitations. Feedback is also limited in its ability to improve large signal performance by the dynamic range of error correcting circuitry within the feedback loop.

Cascode topologies are another prior art technique used to improve the non-linear characteristics of amplifiers. Cascode circuit topologies are commonly used to improve amplifier performance by adding transistors which maintain a primary amplifying transistor at a constant operating voltage. This technique can be used to widen bandwidth and improve linearity in voltage gain amplifiers. However, Cascode techniques are limited in their application to current only gain amplifiers. In addition, Cascode circuitry also suffers from a reduction in signal swing due to voltage drops required for the additional Cascode devices.

SUMMARY OF THE PRESENT INVENTION

It Is the main objective of the present invention to provide an improved amplifier that functions in its linear operating range during large signal mode of operation.

The performance of the amplifier, according to the teaching of the present invention, is improved by dynamically varying the bias current of a transistor which is used in a current gain configuration. This technique improves many characteristics such as input impedance, bandwidth and linearity. More importantly, these improvements are achieved without the limitations of negative feedback or Cascode configurations. Since these improvements are achieved without increasing supply current, the technique provides a significant improvement in performance versus power consumption tradeoffs. It should also be noted that the technique described in detail below is applicable to many different types of amplifier topologies and can also be used in addition to negative feedback and/or Cascode topologies for even greater performance enhancement.

The improved amplifier includes a circuit arrangement that provides a bias current ($I_Q$) which is a function of an input signal ($V_{IN}$) and a load $Z_L$. The mathematical expression for the relationship between $I_Q$, $V_{in}$ and $Z_L$ is $I = f(V_{IN}, Z_L)$. Stated another way, $I_Q = I - AV_{IN}/Z_L$ where $I_Q$ represents the biasing current, $I_e$ represents the emitter current in a device configured in a voltage follower configuration, A represents the amplifier gain, $V_{IN}$ represents the input signal and $Z_L$ is a load impedance.

In a specific configuration, the improved amplifier includes a differential stage formed from a pair of differential transistors. An emitter follower transistor is connected to the differential stage. A current source interconnects the emitter terminals of the differential pair transistors to a negative rail of a power supply. Another emitter follower transistor is connected to the differential stage. A load circuit with an impedance characteristic similar to that of the load which the amplifier drives is connected to the emitter electrode of said another emitter follower. As a result, a biasing current $I_Q$ is generated and is coupled into the emitter follower transistor by a current mirroring circuit.

The foregoing features and advantages of the invention will be more fully described in the accompanying drawings.

DESCRIPTION OF THE PREFERRED EMBODIMENT

Figure 1:
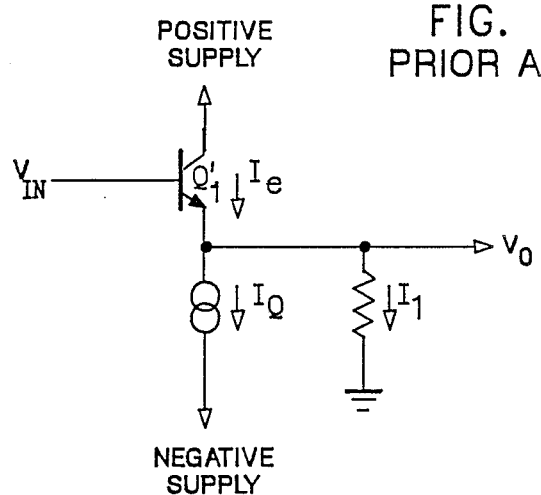
FIG. 1 shows a prior art emitter follower amplifier operated in Class A mode. The figure is helpful in understanding the problem which the present invention corrects.
Figure 2:
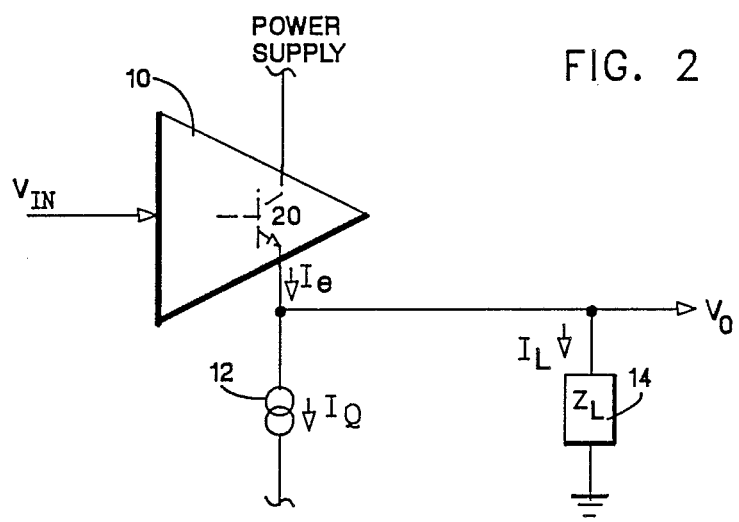
FIG. 2 shows an electrical schematic of a circuit which includes the teachings of the present invention.

FIG. 2 shows an electrical schematic of a circuit according to the teachings of the present invention. The circuit comprises an amplifier 10 connected to current source 12 and load means 14. A power supply is connected to the amplifier and provides power thereto. The amplifier has an input terminal which accepts an input signal $V_{IN}$ and an output terminal for providing an output voltage $V_o$. The amplifier 10 may include a plurality of input stages coupled to an output stage represented by device 20 which is arranged in an emitter follower configuration. In the preferred embodiment device 20 is a transistor. It should be noted that the present invention is applicable to amplifiers whose output stage is configured differently. Thus, the emitter follower configuration is only illustrative of applicant's invention and should not be construed as a limitation on the scope of the present invention.

Still referring to FIG. 2, the key to the variable bias current is to make the bias current $I_Q$ a function of signal level in such a way that the transistor emitter current ($I_e$) and collector current remain constant or nearly constant as load current ($I_L$) varies. The mathematical expression for this relationship is $I_Q = f(V_{IN}, Z_L)$ where $I_Q$ represents the bias current, $V_{IN}$ represents the input signal and $Z_L$ represents the load. The mathematical expression can be stated more precisely as $I_Q = I_e - AV_{IN}/Z_L$ where $I_Q$ represents the bias current. $I_e$ represents the emitter current. A represents the gain of the amplifier. Vi represents the input signal and $Z_1$ represents the load impedance.

Figure 3:
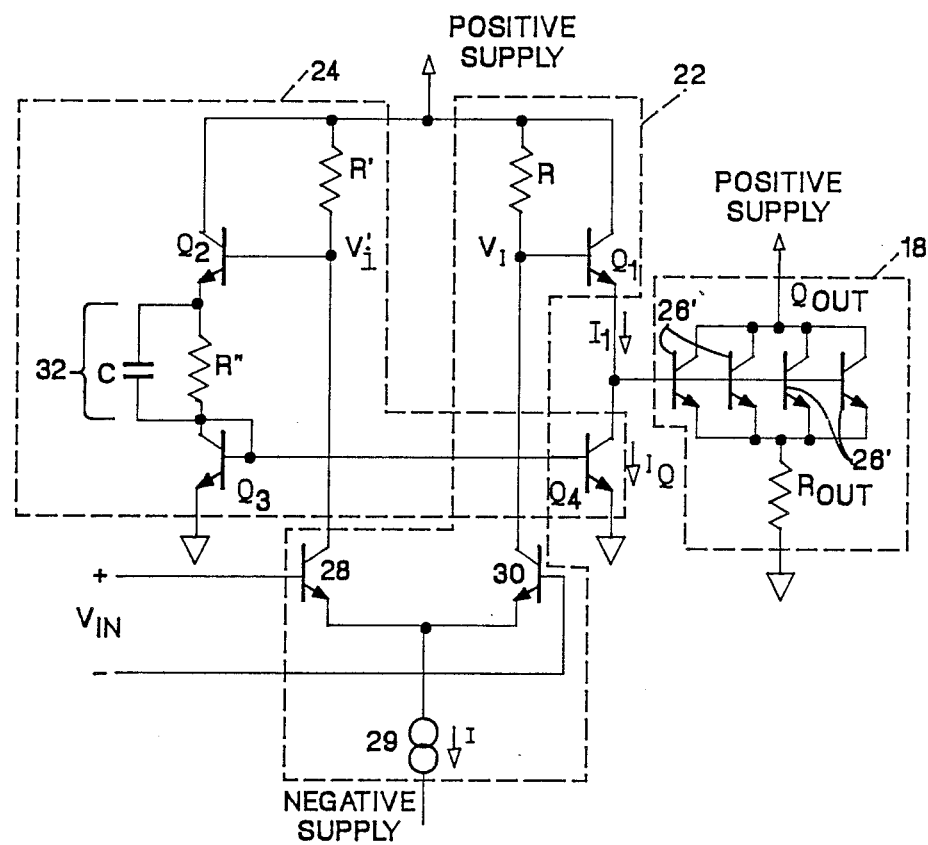
FIG. 3 shows an electrical circuit of an amplifier according to the teachings of the present invention.

FIG. 3 shows a detailed circuit arrangement for an amplifier according to the teachings of the present invention. The circuit arrangement includes the last two stages of an amplifier which are identified by numeral 22, a circuit arrangement 24 which biases the amplifier and an output load circuit 18. As described previously, $I_Q$ is made to be a function of $V_{IN}$ and output load 18 so that the current through the amplifier is constant. The amplifier 22 includes a differential stage formed by circuit components 28, 30, R and R'. A constant current source 29 interconnects the differential stage to the negative rail of the power supply. The differential stage is coupled to the output stage which is formed by NPN transistor Q1. The transistor Q1 is configured in an emitter follower configuration. As stated previously, the emitter follower configuration is only illustrative, and other types of configurations may be used without departing from the spirit and scope of the present invention.

Still referring to FIG. 3, values for R' and R are selected based upon the type of amplifier that one is designing. Selection of appropriate values is well within the skill of the art and therefore no specific values will be given. In the preferred embodiment of this invention R' = R/2. Of course, it is within the skill of the art to change the ratio between R' and R without deviating from the scope or spirit of the present invention. As can be seen from FIG. 3, the differential amplifier receives the input signal $V_{IN}$, amplifies it and delivers it as single-ended signal $V_i$ on the base of device Q1. Simultaneously, one-half the negative phase of $V_i$ is provided at $V'_i$. A mathematical expression for this relationship may be stated as $V'_i = V_i/2$. As will be explained subsequently, $V_i$ is buffered by Q1 and converted to a current used for driving load 18. Also, $V'_i$ is processed by a circuit arrangement 24 and generates the current $I_Q$ which biases $Q_1$.

Still referring to FIG. 3, circuit arrangement 24 includes a current mirror formed by devices Q3 and Q4, a device Q2 coupled in an emitter follower configuration and an RC circuit arrangement 32. The RC circuit arrangement 32 is approximately two times the impedance of the equivalent load circuit 18. The RC circuit arrangement 32 generates the current which is reflected as $I_Q$ in the emitter circuit of Q1. As can be seen from FIG. 3, the voltage $V'_i$ is provided at the base of $Q_2$ and is converted into a current by the RC circuit configuration. This current is mirrored into the emitter terminal of Q1 by Q3 and Q4.

Still referring to FIG. 3, the load circuit 18 which is driven by the improved amplifier includes a high current circuit formed from four parallel interconnected transistors 26'. The emitter terminal of the transistors is connected through a resistor $R_{out}$ to a reference voltage level (not shown). It is connected to ground and the collector electrodes of the transistor 26' are connected to the positive terminal of the power supply. As stated above, other types of load circuits can be designed without departing from the scope or spirit of the present invention.

In operation, an input signal $V_{IN}$ is applied to the differential inputs of the differential amplifier. The differential amplifier generates opposite polarity voltages $V_i$ and $V'_i$. The $V_i$ and $V'_i$ voltages are out of phase signal with $V'_i = V_i/2$. The voltage $V_i$ drives Q1 which generates current $I_1$ for driving load 18. Similarly, the $V'_i$ voltage drives emitter follower Q2 and RC circuit arrangement 32 provides current into current mirrors Q3 and Q4. The signal variable current sunk by Q4 is opposite in phase to Il. This makes $I_Q$ the desired function of $V_{IN}$. In this embodiment the quiescent current in Q1 is set by the difference between the quiescent voltage at $V'_i$ and the ground supply (minus two times $V_{be}$) divided by $Z_L$ where $2V_{be}$ represents the base emitter voltages of Q1 and Q3. The impedance of 32 is twice the value of circuit 18's load impedance.

As can be seen from FIG. 3, the input impedance $Z_L$ of the compound output transistor is both resistive and capacitive. Thus, circuit arrangement 32 has both a resistive portion and a capacitive portion. It should be noted that the load 32 must have characteristics equivalent to that of the output load which the amplifier is driving. It should also be noted that the biasing current $I_Q$ has a static portion and a dynamic portion. For FIG. 3 the static portion of $I_Q$ was obtained by ratioing or "selecting a ratio for the" collector resistors (R and R') and the load which Q2 drives.

While the invention has been particularly shown and described with reference to the preferred embodiment thereof, it will be understood by those skilled in the art that various changes in form and details may be made therein without departing from the spirit and scope of the invention.

Having thus described the invention, what is claimed as new and desired to secure by Letters Patent is:

I claim:

1. An improved amplifier circuit arrangement comprising:
    a first circuit means for receiving and amplifying a signal;
    a load circuit connected to said first circuit means; and a second circuit means coupled to the first circuit means, said second circuit means generating a current $$I_Q = I_e - AV_{in}/Z_L$$

where I represents a bias current for biasing the first circuit means, $I_e$ represents a current flowing in an output stage of said first circuit means, A represents the gain of said first circuit means, $Z_L$ represents impedance of the load circuit and $V_{IN}$ represents the signal.

2. The circuit arrangement of claim 1 further including a power source for supplying power connected to said amplifier circuit arrangement.

3. The circuit arrangement of claim 1 wherein the first circuit means includes a differential amplifier which receives the signal and generates a pair of differential voltages therefrom; and an emitter follower device connected to the differential amplifier.

4. The improved amplifier circuit arrangement of claim 1 wherein the second circuit means includes a transistor arranged in an emitter follower configuration; and a circuit having characteristics equivalent to the load circuit coupled to the transistor.

5. The improved amplifier of claim 4 wherein the circuit includes a RC configuration.

6. An improved amplifier circuit arrangement comprising:
a first circuit means for receiving and amplifying a signal;
a power source coupled to the first circuit means;
a load circuit connected to said first circuit means said load circuit includes a plurality of transistors connected in parallel with each transistor having an emitter electrode connected to a common node and a collector electrode connected to the power source;
a second circuit means coupled to the first circuit means, said second circuit means generating a current $$I_Q = I_e - AV_{in}/Z_L$$

where $I_Q$ represents the current for biasing the first circuit means, $I_e$ represents a current flowing in an output stage of said first circuit means, A represents the gain of said first circuit means, $Z_L$ represents impedance of the load circuit and $V_{IN}$ represents the signal.

7. A circuit arrangement for biasing an amplifier comprising:
a first circuit means for receiving and amplifying a signal; said first circuit means including a differential stage formed from a pair of devices connected in a differential configuration and an output device coupled to the differential stage;
a current source coupled to the pair of differential devices;
an output load circuit means coupled to the output device;
an input load circuit means coupled to the differential stage; said input load circuit means responsive to a differential voltage provided by the differential stage and to generate therefrom a current signal which varies as a function of an output load current so that current flowing in said output device is substantially constant even though the output load current varies; and
a circuit means, for mirroring said current signal, interconnecting the output device and the input load circuit means.

8. The improved amplifier circuit of claim 7 further including a power supply for supplying power to said amplifier.

9. A circuit arrangement for biasing an amplifier comprising:
a circuit means coupled to an input stage of said amplifier, said circuit means responsive to a reference signal and generating therefrom a bias current whose magnitude varies so that $I_Q = I_e - A V_{IN}/Z_L$ with $I_Q$ represents the bias current, $I_e$ represents a current flowing in an output stage of said amplifier, A represents the gain of said amplifier, $Z_L$ represents impedance of a load circuit connected to an output of the amplifier and $V_{IN}$ represents an input signal;
and a current mirror circuit means interconnecting the circuit means to an output stage of said amplifier said current mirror circuit means mirroring the bias current to the output stage of said amplifier.

10. The circuit arrangement of claim 9 wherein the reference signal includes a voltage having a value $V'_i = V_i/n$ wherein $V'_i$ represents the negative phase of an input voltage, $V_i$ represents the positive phase of said input voltage and n represents a positive integer.

11. The circuit arrangement of claim 10 wherein n=2.

12. The circuit arrangement of claim 10 wherein the circuit means includes a transistor having an emitter electrode, a base electrode coupled to the reference signal and a collector electrode for coupling to a power supply; and
a RC circuit coupled to the emitter electrode of said transistor.

13. An improved circuit arrangement comprising:
a differential amplifier means for receiving an input signal and generating therefrom differential voltages $V'_i$ and $V_i$;
a first transistor configured in an emitter follower configuration, being responsive to voltage $V_i$ to generate a current for driving an output load;
a second transistor coupled to the differential amplifier, said transistor having an emitter electrode and a base electrode to receive voltage $V'_i$;
a circuit means for generating a control current representative of a load current connected to the emitter electrode of said second transistor; and
a circuit means for mirroring the control current into said first transistor interconnecting the first transistor to the second transistor.

* * * * *